United States Patent [19]

Edler et al.

[11] Patent Number: 5,528,610
[45] Date of Patent: Jun. 18, 1996

[54] BOUNDARY TEST CELL WITH SELF MASKING CAPABILITY

[75] Inventors: Christopher L. Edler, Los Angeles; William D. Farwell, Thousand Oaks; Ian Herman, Hermosa Beach; Tuan M. Hoang, La Mirada; Brian F. Keish, Stanford; Alida G. Mascitelli, Northridge, all of Calif.

[73] Assignee: Hughes Aircraft Company, Los Angeles, Calif.

[21] Appl. No.: 876,534

[22] Filed: Apr. 30, 1992

[51] Int. Cl.⁶ .................................................. G01R 31/28
[52] U.S. Cl. .................... 371/22.3; 371/22.6; 324/76.11; 324/158.1
[58] Field of Search .................................. 371/22.3, 22.1, 371/15.1, 22.2, 22.4, 22.6, 27, 72; 324/73.1, 158 R

[56] References Cited

U.S. PATENT DOCUMENTS

| | | | |
|---|---|---|---|
| 4,441,075 | 4/1984 | McMahon | 324/73 R |
| 5,008,886 | 4/1991 | Chinnaswamy et al. | 371/40.2 |
| 5,084,874 | 1/1992 | Whetsel, Jr. | 371/22.3 |
| 5,206,584 | 4/1993 | Nishimori | 324/158 R |
| 5,220,281 | 6/1993 | Matsuki | 371/22.3 |
| 5,230,000 | 7/1993 | Mozingo et al. | 371/22.4 |
| 5,252,917 | 10/1993 | Kadowaki | 371/22.3 |
| 5,252,971 | 10/1993 | Franz et al. | 341/26 |
| 5,260,948 | 11/1993 | Simpson et al. | 371/22.3 |
| 5,319,646 | 7/1994 | Simpson et al. | 371/22.3 |

Primary Examiner—Robert W. Beausoliel, Jr.
Assistant Examiner—Dieu-Minh Le
Attorney, Agent, or Firm—Leonard A. Alkov; W. K. Denson-Low

[57] ABSTRACT

Boundary scan cells including mask circuitry having a mask latch for storing a mask flag that is serially scanned into the cell via a scan flip-flop. In a boundary scan cell having an output function, control circuitry responsive to the mask flag forces or holds the output of the cell at a state determined by one or more values scanned into the cell via the scan flip-flop if the mask flag is of a predetermined state that indicates the cell is masked. In a boundary scan cell having an input function, control circuitry responsive to the mask flag connects the output of the scan flip-flop to the input of the scan flip-flop if the mask flag is of a predetermined state that indicates the cell is masked.

3 Claims, 4 Drawing Sheets

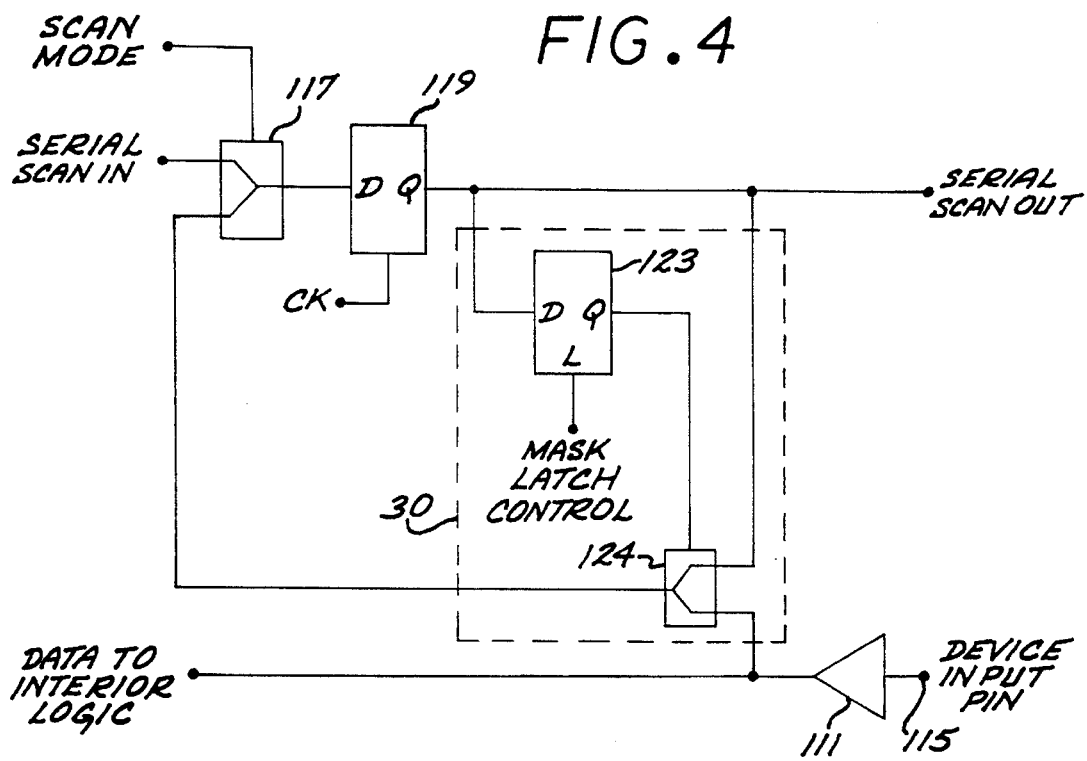
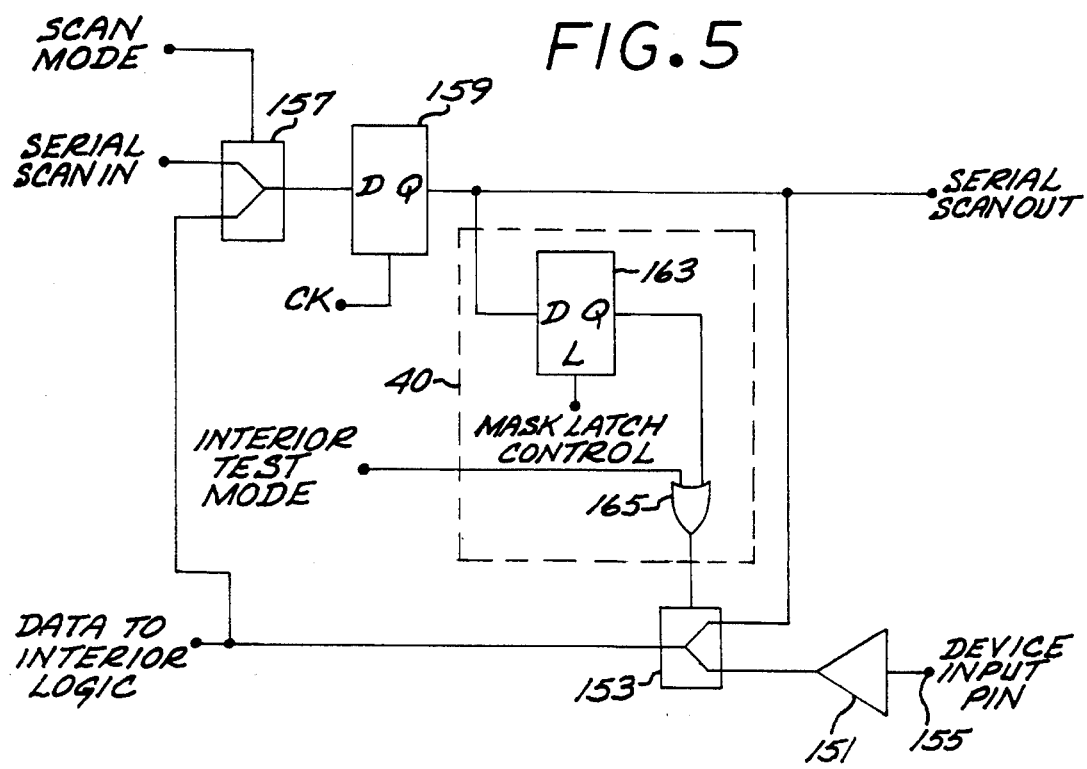

BOUNDARY TEST CELL WITH SELF MASKING CAPABILITY

BACKGROUND OF THE INVENTION

The subject invention is directed generally to boundary scan test cells, and is directed more particularly to input and output boundary scan test cells having programmable mask capability.

Boundary scan testing is commonly utilized to test the interconnections between digital devices that comprise a system, where the interconnected devices can include integrated circuits, application specific integrated circuits (ASICs), hybrids, and circuit boards, for example. For boundary scan test capability, a device includes scan circuits that are capable of isolating device I/O pins from the interior logic of the device and directly accessing such I/O pins, which allows special interconnection test patterns to be applied and observed without interference from the interior logic functions.

Boundary scan test capability is commonly implemented with boundary scan cells respectively associated with those I/O pins for which boundary scan testing capability is being provided, with each boundary scan cell containing a scan flip-flop. The scan flip-flops are arranged into a register chain that is capable of operation in serial and parallel modes, so that test patterns can be loaded serially, applied in parallel, and test results can be read out serially.

For testing, special interconnection test patterns are serially loaded into scan flip-flops for output pins,. After a test pattern is loaded, the output scan cells containing the test pattern are switched to drive their associated output pins in accordance with the test pattern. Subsequently, the signals observed on input pins are stored in associated input scan flip-flops. The stored inputs are then serially read out to evaluate the test. A further test pattern can be serially loaded into output scan flip-flops while stored inputs are being serially read out.

Boundary scan test patterns are basically designed to achieve the following:

1. To drive each device output under test to the high state and to the low state at different times. Proper reception at the appropriate inputs verifies continuity.
2. To drive each device output under test to the state opposite that of all other outputs, for both the low state and the high state. A short circuit between two or more outputs will be indicated by contention between the shorted drivers.

The paper "INTERCONNECT TESTING WITH BOUNDARY SCAN," Wagner, IEEE Proc. 1987 International Test Conference, pages 52–57, generally describes the application and implementation of boundary scan testing, and test patterns that allow for efficient boundary scan testing.

When tests are preformed on digital systems, it is often necessary or preferable to hold particular device outputs at predetermined logic states and/or to disregard the signal at a device input. This may be done for various reasons including the following:

1. In applications where outputs from a plurality of devices share a common bus, contention is prevented by allowing only one device to be active on the bus at any given time. The outputs of the devices which are not active on the bus are controllably masked, for example by being held in the high impedance state (commonly designated by the letter Z).
2. During interconnect testing of an application that includes memories, chip enable or write enable signals provided by a boundary scanned device to the memories must be held at a level (1 or 0 depending upon implementation) to prevent unintended writing of data into memory.
3. While a particular device is being internally tested, interconnections between its interior and its outputs must be held in fixed state (typically, but not always, the Z state) so as to avoid conflicts with other devices, which may be simultaneously under test, or which may be continuing to function while the device under test performs a concurrent self test.
4. When a device is a multi-chip module (MCM), and interconnections between its I/O pins and those of other MCMs are being tested, it is desirable to mask off the I/O internal to the MCM, which allows external I/O errors to be differentiated from internal I/O errors when signatures are used for response evaluation.
5. During interconnect testing, certain inputs may be in a "don't care," but indeterminate, state. When signatures are used for response evaluation, it is important to hold these in a known state. Masking allows the indeterminate state to be disregarded, and a known state substituted.
6. It is often desirable to perform logic tests (as opposed to interconnect tests) which involve 2 or more, but not all, connected devices. Input masking provides a means of excluding interference from devices not participating in such tests.

The required masking may be a part of a stored test pattern set. However, it is often desirable to use hard-wired algorithms to generate tests, and to use signature evaluators for the response, which results in a more efficient, faster test. When hardwired algorithmic tests are used with known boundary scan cells, the required masking is typically achieved by placing those boundary cells to be masked into separate serial scan chains (or groups). Since there may be many such chains on a VLSI integrated circuit (IC), the design becomes complex. The numerous chains must all be accessed and controlled by typically a single serial test bus which accesses the IC. Further, the I/O pins associated with a group are preferentially placed in a physically contiguous manner in order to make the layout and routing of the IC as efficient as possible, but this is often impossible to achieve. Further, known practice requires that the I/O of a lower assembly or device which are connected to the I/O of a higher assembly (i.e., which contains the lower assembly or device) be placed in special scan groups. This prevents the use of that assembly or device in any other higher assembly that requires different connections to its I/O.

SUMMARY OF THE INVENTION

It would therefore be an advantage to provide boundary scan cells having programmable mask capability.

The foregoing and other advantages are provided by the invention in a boundary scan cell that includes a mask circuit having a mask latch for storing a mask flag that is serially scanned into the cell via a scan flip-flop. In a boundary scan cell having an output function, control circuitry responsive to the mask flag forces or holds the output of the cell at a state determined by one or more values scanned into the cell via the scan flip-flop if the mask flag is of a predetermined state that indicates the cell is masked. In a boundary scan cell having an input function, control circuitry responsive to the mask flag connects the output of the scan flip-flop to the input of the scan flip-flop if the mask flag is of a predetermined state that indicates the cell is masked.

BRIEF DESCRIPTION OF THE DRAWINGS

The advantages and features of the disclosed invention will readily be appreciated by persons skilled in the art from the following detailed description when read in conjunction with the drawing wherein:

FIG. 4 is a schematic diagram of an input boundary scan cell in accordance with the invention.

FIG. 5 is a schematic diagram of a further input boundary scan cell in accordance with the invention.

DETAILED DESCRIPTION OF THE DISCLOSURE

Figure 1:
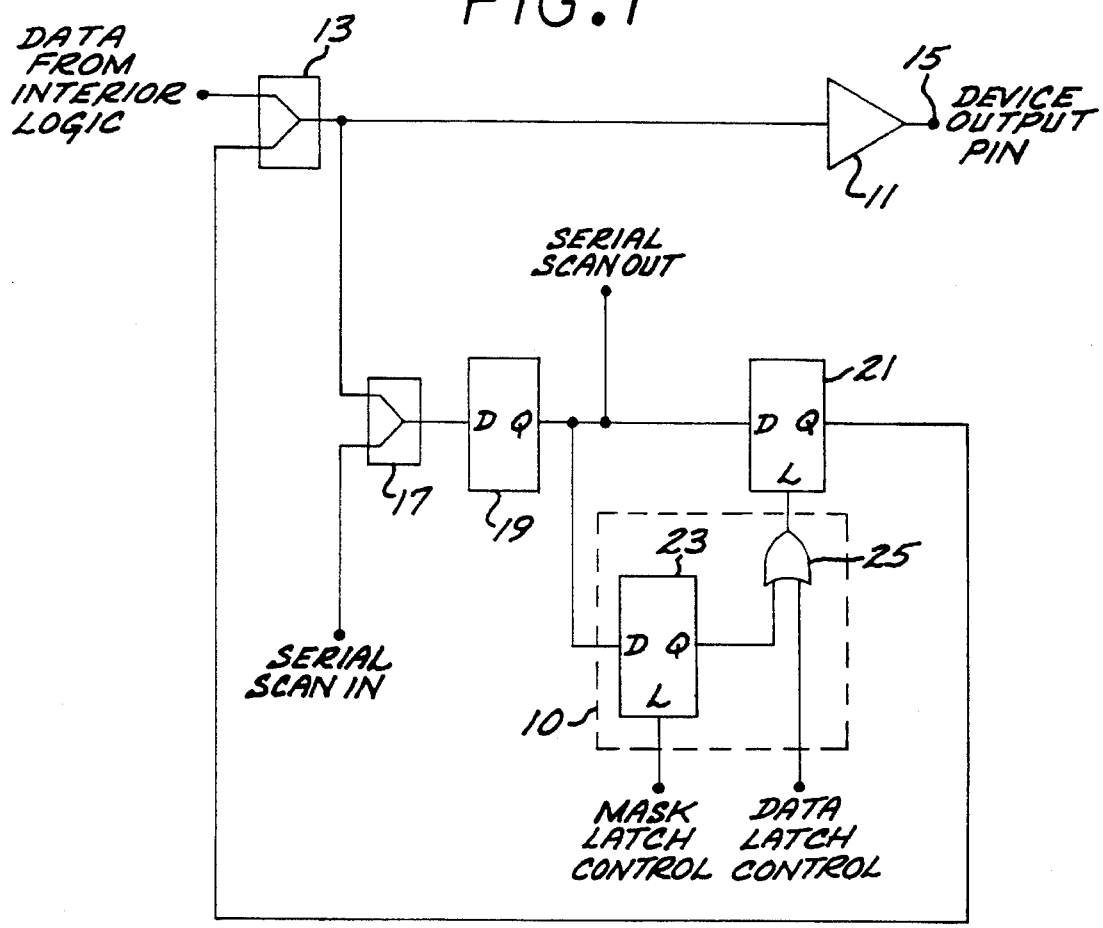
FIG. 1 is a schematic diagram of an output boundary scan cell in accordance with the invention.

In the following detailed description and in the several figures of the drawing, like elements are identified with like reference numerals.

The subject invention is directed to boundary scan cell structures having mask circuits. The boundary scan cells are intended to be implemented in scan chains in integrated circuit devices, and since the structure and operation of scan chains are known to persons skilled in the art the following will be directed primarily to the boundary scan cell structures rather than the scan chains.

FIG. 1 schematically illustrates a device output boundary scan cell that includes a mask circuit 10 in accordance with the invention. The boundary scan cell includes an output buffer 11 which receives its input from a 2-to-1 output multiplexer 13 and has its output connected to an associated device output pin 15. The output of the multiplexer 13 is further provided as one input of a 2-to-1 scan multiplexer 17 whose output is provided to a scan flip-flop 19. The other input to the scan multiplexer 17 is provided by the Q output of a scan flip-flop prior in sequence in the scan chain in which the scan flip-flop 19 is implemented or by the external serial input to the scan chain. The output of the scan flip-flop 19 is provided to the scan flip-flop next in sequence in the scan chain or to the serial output of the scan chain, and is further provided to a data hold latch 21 whose output is provided as an input to the output multiplexer 13. The data hold latch 21 is transparent when the input to its L control input is a 0, and latches when the input to its L control input is a 1, such that it retains its contents when latched irrespective of the state of its D input. The input to the L control input of the data latch is normally a 1, except when the content of the latch is being updated.

The mask circuit 10 includes a mask latch 23 that receives the Q output of the scan flip-flop 19 at its D input, and further receives a mask latch control signal at its L control input. The mask latch 23 is transparent when the mask latch control signal is a 0, and latches when the mask latch control signal is a 1, such that it retains its contents when latched irrespective of the state of its D input. The input to the L control input of the mask latch is normally a 1, except when the content of the latch is being updated. The Q output of the mask latch 23 is provided as one input to an OR gate 25 which receives a data latch control signal as its other input. The output of the OR gate 25 is provided to the L control input of the data hold latch 21.

In use, respective boundary scan cells as shown in FIG. 1 are respectively implemented for each of the output pins of an integrated circuit device, and such boundary scan cells are all connected in a serial scan chain via the serial connections of the scan flip-flops of the cells. As implemented in a serial scan chain, each boundary scan cell as shown in FIG. 1 operates as follows.

1. The output of the mask latch 23 is set to 0, for example by serially scanning a 0 into the scan flip-flop 19, and then momentarily toggling the mask latch control signal to 0, whereby the 0 output of the scan flip-flop is latched in the mask latch 23 when the mask latch control signal returns to 1.

2. The mask value (i.e., the desired masked state of the output of the output buffer 11) is serially scanned into the scan flip-flop 19.

3. The data latch control signal is then momentarily toggled to 0, which loads the mask value into the data hold latch 21.

4. A mask flag (i.e., a value that determines whether the cell is to be masked) is serially scanned into the scan flip-flop 19. For the particular implementation of FIG. 1, a mask flag of 1 results in the cell being masked, while a mask flag of 0 results in the cell not being masked.

5. The mask latch control signal is momentarily toggled, which loads the mask flag into the mask latch 23.

During subsequent test operations, the multiplexers 13 and 17 are configured to connect the output of the data hold latch 21 to the output driver 11 and to the D input of the scan flip-flop 19, and the mask latch control is held at 1. If the mask latch contains a 0, the cell is not masked, and the data hold latch responds according to the data latch control signal, which is driven by test algorithms. If the mask latch contains a 1, the cell is masked since the input to the latch control of the data hold latch of the cell is held at 1, and the data hold latch will retain the mask value previously latched therein regardless of the values to which the data latch control signal is driven by test algorithms.

Figure 2:
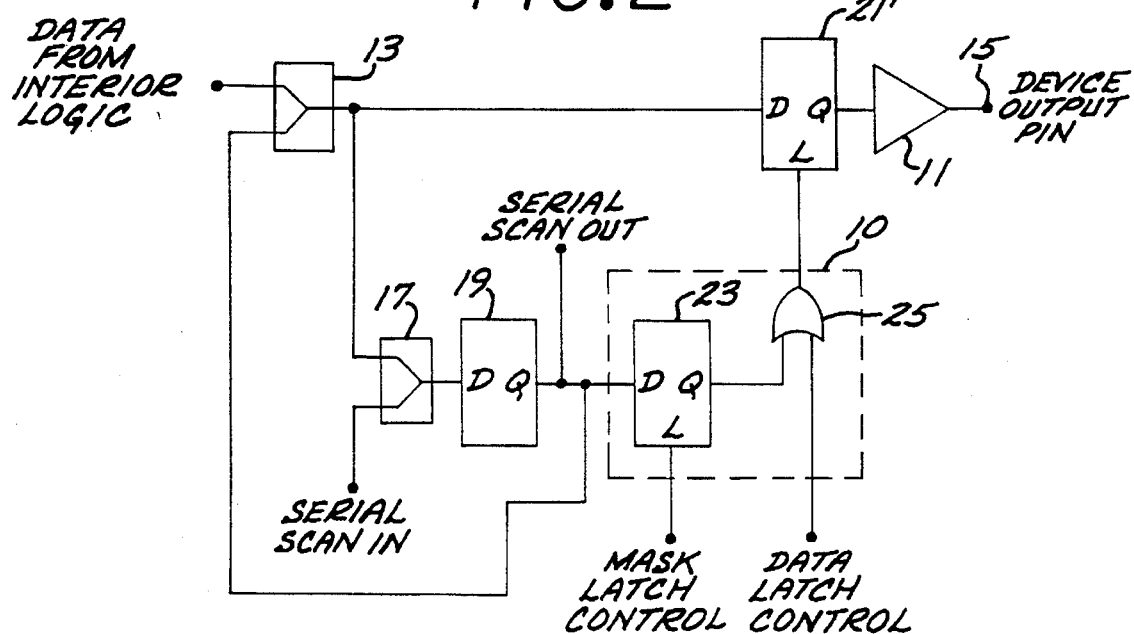
FIG. 2 is a schematic diagram of a further output boundary scan cell in accordance with the invention.

FIG. 2 schematically illustrates a further device output boundary scan cell that includes the mask circuit 10 as included in the boundary scan cell of FIG. 1. The boundary cell of FIG. 2 is similar to the boundary cell of FIG. 1, except as to the position the data hold latch which is identified in FIG. 2 by the reference numeral 21' to indicate a difference as to the cell of FIG. 1. In particular, the data hold latch is positioned between the output multiplexer 13 and the output buffer 11. For masking, the cell of FIG. 2 functions substantially the same as the cell of FIG. 1.

Figure 3:
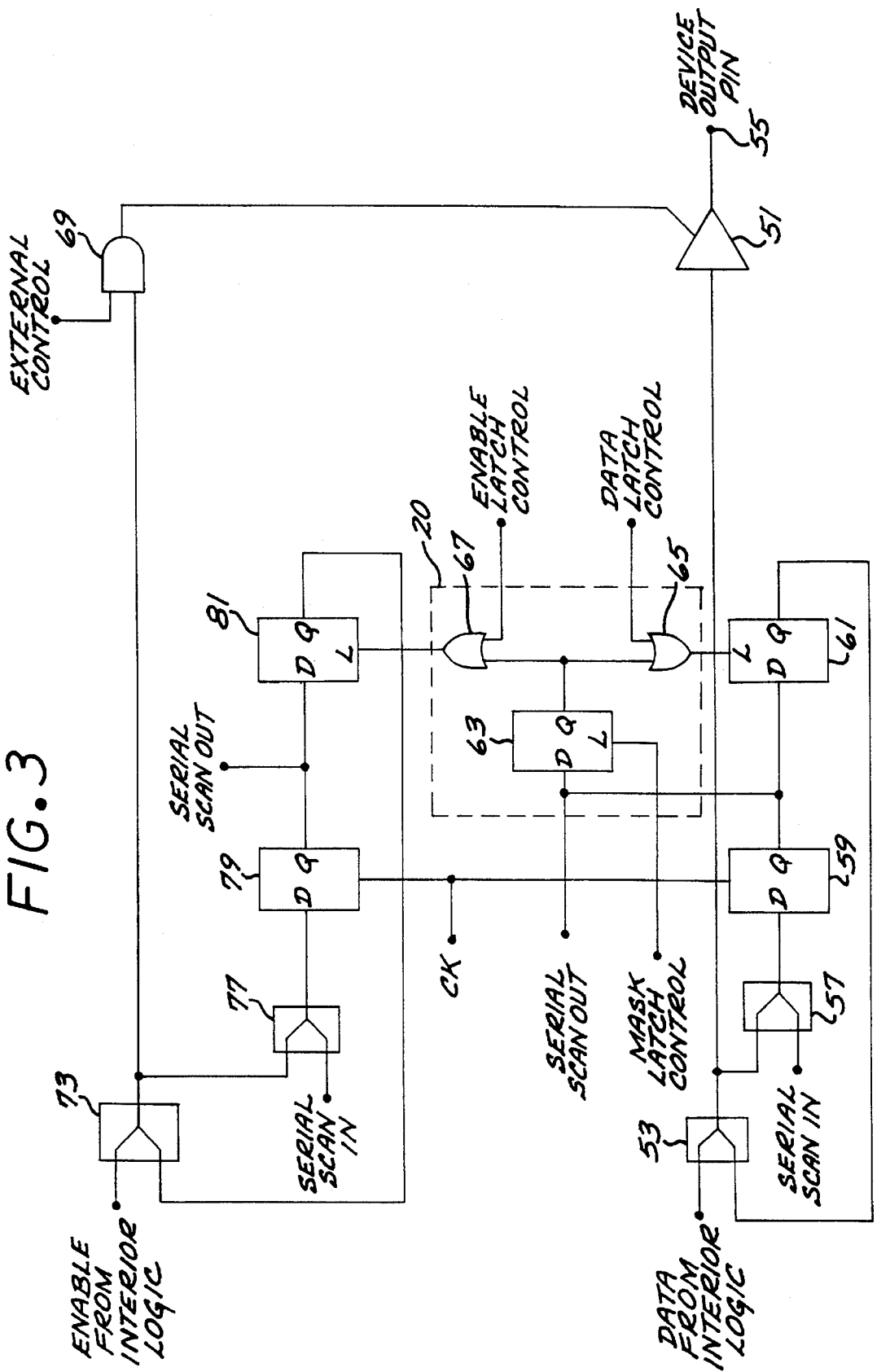
FIG. 3 is a schematic diagram of a three-state output boundary scan cell in accordance with the invention.

Referring now to FIG. 3, schematically depicted therein is a three-state output boundary scan cell that includes a mask circuit 20 in accordance with the invention. The boundary scan cell includes a three-state output buffer 51 which receives its input from a 2-to-1 output multiplexer 53 and has its output connected to an associated device output pin 55. The output of the multiplexer 53 is further provided as one input of a 2-to-1 scan multiplexer 57 whose output is provided to a scan flip-flop 59. The other input to the scan multiplexer 57 is provided by the Q output of a scan flip-flop prior in sequence in the scan chain in which the scan flip-flop 59 is implemented or by the external serial input to the scan chain. The output of the scan flip-flop 59 is provided to the scan flip-flop next in sequence in the scan chain or to the serial output of the scan chain, and is further provided to a data hold latch 61 whose output is provided as an input to the output multiplexer 53. The data hold latch 61 is transparent when the input to its L control input is a 0, and latches when the input to its L control input is a 1, such that it retains its contents when latched irrespective of the state of its D input. The input to the L control input of the data hold latch is normally a 1, except when the content of the latch is being updated.

The output buffer 51 is controlled by the output of an enable AND gate 69 so as to be enabled when the output of the enable gate is 1, and to be in the high impedance state when the output of the enable gate 69 is a 0. The inputs to the enable AND gate 69 are an external control signal that can be provided by test equipment and the output of an enable 2-to-1 multiplexer 73. The output of the enable multiplexer 73 is further provided as one input of a 2-to-1 scan multiplexer 77 whose output is provided to an enable test flip-flop 79. The other input to the scan multiplexer 77 is provided by the Q output of an enable test flip-flop prior in sequence in the scan chain in which the enable test flip-flop 79 is implemented or by the external serial input to the scan chain. The output of the enable test flip-flop 79 is provided to the scan flip-flop next in sequence in the scan chain or to the serial output of the scan chain, and is further provided to a enable hold latch 81 whose output is provided as an input to the enable multiplexer 73. The enable hold latch 71 is transparent when the input to its L control input is a 0, and latches when the input to its L control input is a 1, such that it retains its contents when latched irrespective of the state of its D input. The input to the L control input of the enable hold latch is normally a 1, except when the content of the latch is being updated.

The mask circuit 20 includes a mask latch 63 that receives the Q output of the scan flip-flop 59 at its D input, and further receives a mask latch control signal at its L control input. The mask latch 63 is transparent when the input to its L control input is a 0, and latches when the input to its L control input is a 1, such that it retains its contents when latched irrespective of the state of its D input. The input to the L control input of the mask latch is normally a 1, except when the content of the latch is being updated. The Q output of the mask latch 63 is provided as one input to an OR gate 65 and as one input to an OR gate 67. A data latch control signal is provided as the other input to the OR gate 65 while a data latch control signal is provided as the other input to the OR gate 67. The output of the OR gate 65 is provided to the L control input of the data hold latch 61, and the output of the OR gate 67 is provided to the L control input of the enable hold latch 81.

In use, respective boundary scan cells as shown in FIG. 3 are respectively implemented for each of the three-state output pins of an integrated circuit device, and such boundary scan cells are all connected in a serial scan chain via serial connections of the scan flip-flops of the cells and serial connections of the enable test flip-flops, for example. Alternatively, scan flip-flops and enable test flip-flops can be connected in the same chain. As implemented in a serial scan chain, each boundary scan cell as shown in FIG. 3 operates as follows.

1. The output of the mask latch 63 is set to 0, for example by serially scanning in a 0 into the scan flip-flop 59, and then momentarily toggling the mask latch control signal to 0, such that the 0 output of the scan flip-flop is latched in the mask latch 23 when the mask latch control signal returns to 1.

2. Appropriate mask values are serially scanned into the enable test flop-flop 79 and the scan flip-flop to specify the desired mask output state of the cell (i.e., the state to which the output of the three-state output buffer is locked). For the specific embodiment of FIG. 3, the masked output state depends on the enable test flip-flop and the scan flip-flop as follows:

| ENABLE TEST FLIP-FLOP | SCAN FLIP-FLOP | MASK OUTPUT |
|---|---|---|
| 1 | 0 | 0 |
| 1 | 1 | 1 |
| 0 | X (don't care) | Z (high impedance) |

Effectively, if the cell is masked, the output buffer will be disabled if the mask value scanned into the enable test flip-flop is a 0. If the mask value scanned into the enable test flip-flop is a 1, the output buffer is enabled and provides an output that corresponds to the contents of the mask value scanned into the scan flip-flop.

3. The mask latch control and enable latch control signals are both momentarily toggled to 0, which loads the mask values into the data hold latch and the enable test latch, respectively.

4. A mask flag (i.e., a value that determines whether the cell is to be masked) is serially scanned into the scan flip-flop 59. For the particular implementation of FIG. 3, a mask flag of 1 results in the cell being masked, while a mask flag of 0 results in the cell not being masked.

5. The mask latch control signal is momentarily toggled, which loads the mask flag into the mask latch 63.

During subsequent test operations, the multiplexers 53 and 57 are configured to connect the output of the data hold latch 61 to the output driver 51 and to the D input of the scan flip-flop 59; and the multiplexers 73 and 77 are configured to connect the output of the enable hold latch 81 to the enable AND gate 69 and the D input of the enable test flip-flop 79. The mask latch control signal is maintained at 1.

If the mask flag stored by the mask latch is 0, the cell is not masked, and the data hold latch and the enable hold latch respond respectively to the data latch control and enable latch control which are driven by test algorithms.

If the mask flag latched in the mask latch is 1, the cell is masked since the inputs to the latch control inputs of the data hold latch and the enable hold latch would be 1, and both latches would retain the mask control values previously latched therein regardless of the values of the data latch control signal and the enable latch control signal which are driven by test algorithms. Thus, in a masked cell the output state of the output buffer (0, 1, or high impedance) is set by the mask values previously scanned in, and is held in that state regardless of the values scanned into the scan flip-flop 59 and the enable test flip-flop 59 for test purposes after the mask latch 63 has been latched to 1.

Referring now to FIG. 4, schematically depicted therein is an input boundary scan cell that includes a mask circuit 30 in accordance with the invention. The boundary scan cell includes an input buffer 111 that receives its input from an associated device input pin 115. The output of the input buffer is provided as an input to the interior logic of the device. The boundary scan cell further includes a 2-to-1 scan multiplexer 117 having its output connected to the D input of a scan flip-flop 117. One input to the scan multiplexer 117 is provided by the Q output of a scan flip-flop prior in sequence in the scan chain in which the scan flip-flop 119 is implemented or by the external serial input to the scan chain. The output of the scan flip-flop 119 is provided to the scan flip-flop next in sequence in the scan chain or to the serial output of the scan chain.

The mask circuit 30 includes a mask latch 123 and a 2-to-1 multiplexer 124. The mask latch 123 has its D input connected to the output of the scan multiplexer 117, and receives a mask latch control signal at its L control input. The Q output of the mask latch 123 provides the control for the multiplexer 124 whose inputs are provided by the output of the input buffer 111 and the Q output of the scan flip-flop 119. The output of the multiplexer 124 corresponds to the output of the input buffer when the Q output of the mask latch is 0, and corresponds to the Q output of the scan flip-flop 119 when the Q output of the mask latch is 1. The cell is masked by latching a 1 in the mask latch 127, as described further herein, which causes the output of the scan flip-flop 119 to be provided to the input thereof via the scan multiplexer 117 so long as the Q output of the mask latch is 1.

In use, respective boundary scan cells as shown in FIG. 4 are respectively implemented for each of the input pins of an integrated circuit device, and such boundary scan cells are all connected in a serial scan chain via the serial connections of the scan flip-flops of the cells. As implemented in a serial scan chain, each boundary scan cell as shown in FIG. 4 operates as follows.

1. A mask flag is serially scanned into the scan flip-flop 119. For the specific implementation of FIG. 4, a mask flag of 1 will cause the cell is to be masked while a mask flag of 0 will cause the cell to be non-masked.

2. The mask latch control signal is momentarily toggled to 0, which loads the mask flag into the mask latch.

If the mask flag was a 1, the cell is masked and the Q output of the scan flip-flop 119 is provided as an input to the scan multiplexer 117, whereby the output of the scan flip-flop 119 is connected to its input for test purposes. If the mask flag was a 0, the cell is unmasked, so that for test purposes the signal at the device input pin 11 can be stored in the scan flip-flop 119.

FIG. 5 schematically sets forth a further input boundary scan cell that includes a mask circuit 40 in accordance with the invention. The boundary scan cell includes an input buffer 151 that receives its input from an associated device input pin 155. The output of the input buffer 151 is provided as one input to a 2-to-1 input multiplexer 153 which receives its other input from the Q output of a scan flip-flop 159. The output of the multiplexer 153 is provided as an input to the interior logic of the device as well as an input to a 2-to-1 scan multiplexer 157 whose output is provided to the D input of the scan flip-flop 159. The other input to the scan multiplexer 157 is provided by the Q output of a scan flip-flop prior in sequence in the scan chain in which the scan flip-flop 159 is implemented or by the external serial input to the scan chain. The output of the scan flip-flop 159 is provided to the scan flip-flop next in sequence in the scan chain or to the serial output of the scan chain.

The mask circuit 40 includes a mask latch 163 and an OR gate 165. The mask latch 163 has its D input connected to the Q output of the scan flip-flop 119, and receives a mask latch control signal at its L control input. The Q output of the mask latch 163 is provided as one input to the OR gate 165 which receives an interior test mode control signal as its other input. The interior test mode control signal is provided by a test controller internal to the device or by external test equipment, and directs that the interior logic of the device be driven by the output of the scan flip-flop. The output of the OR gate 165 controls the multiplexer 153. When the output of the OR gate 165 is 1, the output of the multiplexer 153 corresponds to the Q output of the scan flip-flop; and when the output of the OR gate 165 is 0, the output of the multiplexer 153 corresponds to the output of the input buffer 151.

The difference between cells of FIGS. 4 and 5 is that the cell of FIG. 5 provides for driving the interior logic from the scan-flip flop 163 for testing of interior logic of the device. During interconnect testing, the interior test mode control signal is set to 0, and only the mask 163 controls the multiplexer 153.

For masking, the cell of FIG. 5 operates similarly to the cell of FIG. 4, and is masked by latching a 1 into the mask latch 163. During interconnect test operations, if a mask flag is latched in the mask latch 163, the multiplexer 153 directs the output of the scan flip-flop 159 to be connected to its input.

Figure 6:
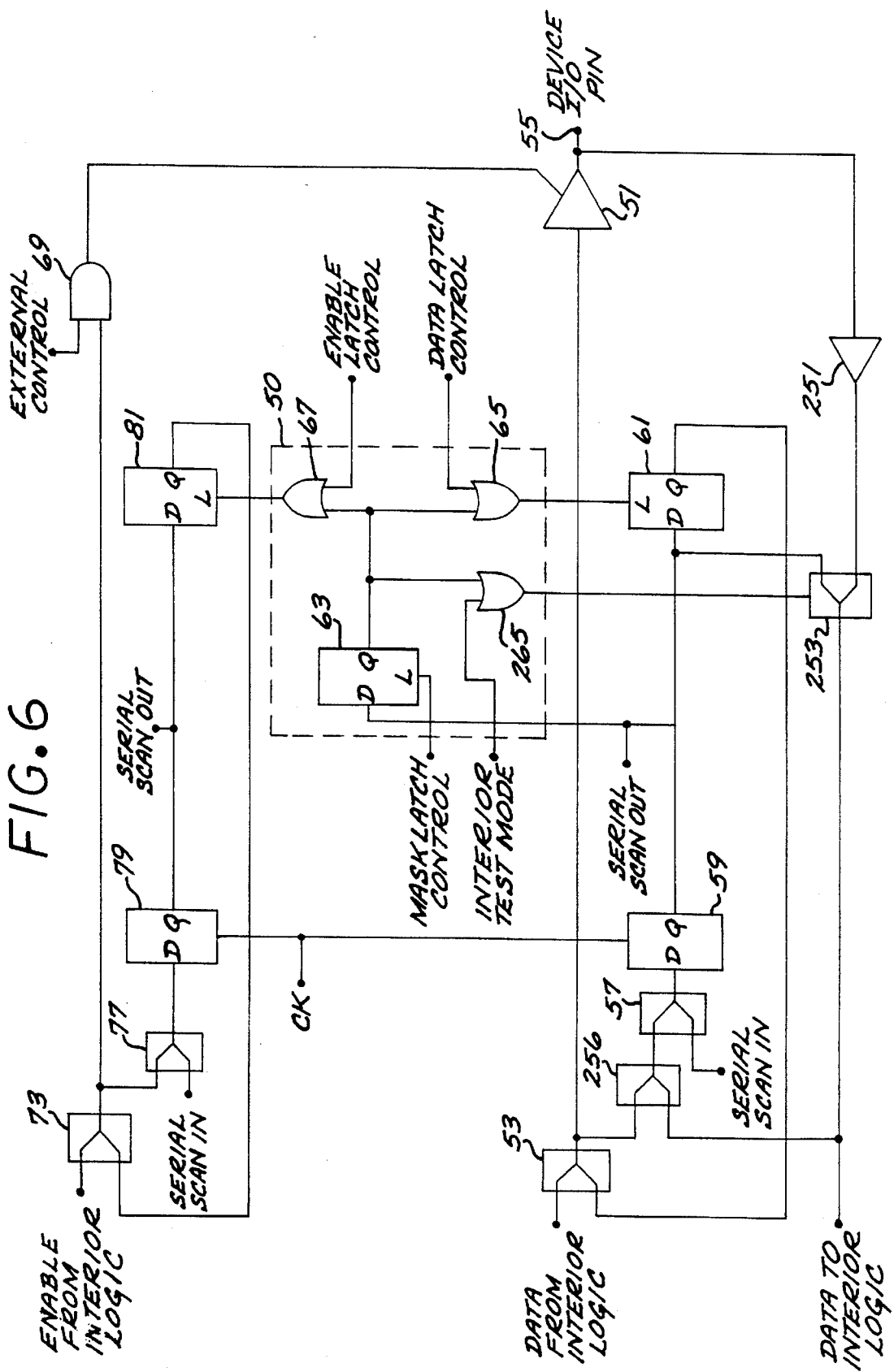
FIG. 6 is a schematic diagram of a bidirectional boundary scan cell in accordance with the invention.

Referring now to FIG. 6, schematically set forth therein is bidirectional boundary scan cell that includes a mask circuit 50 in accordance with the invention. The boundary scan cell of FIG. 5 includes substantially the same components as the cell of FIG. 3, with the corresponding components having the same reference numerals, and additional components for the input function. In particular, the additional components include an input buffer 251, a multiplexer 253, a multiplexer 256, and an OR gate 265. The input buffer 251 receives its input from the I/O pin 55 associated with the cell, and provides its output to the multiplexer 253. The other input of the multiplexer 253 is connected to the Q output of the scan flip-flop 59, and the output of the multiplexer 253 is connected to the interior logic of the device as well as to one input of the multiplexer 256. The multiplexer 256 receives a further input from the output multiplexer 53, and provides its output to the scan multiplexer 57. The OR gate 265 receives one input from the output of the mask latch 63, and receives an internal test mode control signal as its other input. The output of the OR gate controls the multiplexer 253 whose output corresponds to the output of the Q output of the scan flip-flop 59 when the OR gate output is 1. The output of the multiplexer 253 corresponds to the output of the input buffer 251 when the OR gate output is 0.

For masking, the cell of FIG. 6 operates in the same manner as the cell of FIG. 3. When the cell is masked, it operates in the same manner as the cell of FIG. 3 as to the output function, and in the same manner as the cell of FIG. 5 as to the input function. Thus, when the cell is masked, the state of the output buffer is controlled by the mask values latched in the enable hold latch 81 and the scan latch 61; and the Q output of the scan flip-flop 59 is provided as an input to the scan multiplexer 57, whereby the scan flip-flop 59 can store its own output for test purposes. If the cell is unmasked, for test purposes the device input pin 11 is connected to the D input of the scan flip-flop 59. As with the cell of FIG. 5, the OR gate 265 and the multiplexer 253 allows for driving the interior logic with the output of the scan flip-flop 59.

The foregoing has been a disclosure of programmably maskable input and output boundary scan cells, whereby a boundary scan cell having an output function can be individually programmed such that its output is held at a predetermined hold state during testing, and whereby a boundary scan cell having an input function can be individually programmed to observe the state of its own scan flip-flop rather than its input during testing. The programmably maskable input and output boundary scan cells of the invention advantageously avoid the necessity of physically segregating boundary scan cells into different scan chains for purposes of masking during interconnect testing.

Although the foregoing has been a description and illustration of specific embodiments of the invention, various modifications and changes thereto can be made by persons skilled in the art without departing from the scope and spirit of the invention as defined by the following claims.

What is claimed is:

1. A boundary scan test cell system comprising:

a scan flip-flop for receiving a serial input and for providing a scan flip-flop output;

a data latch responsive to said scan flip-flop output for latching a binary mask value and for providing a data latch output;

a mask latch responsive to said scan flip-flop output for latching a binary mask flag and for providing a mask latch output;

control means responsive to said mask latch output for controlling the data latch such that the data latch remains latched at a mask value if the binary mask flag in the mask latch is of a predetermined mask state;

an output buffer having an input; and multiplexing means for controllably providing the output of said data latch to the input of said output buffer.

2. A boundary scan test cell system comprising:

a three-state output buffer having an input;

a scan flip-flop for receiving a serial input and for providing a scan flip-flop output;

a data latch responsive to said scan flip-flop output for latching a binary data mask value and for providing data latch output;

a mask latch responsive to said scan flip-flop output for latching a binary mask flag and providing a mask latch output;

an enable control flip-flop for receiving a serial input and for providing an enable control flip-flop output;

an enable control latch responsive to said enable control flip-flop output for latching a binary enable mask value and providing an enable control latch output;

control means responsive to said mask latch output for controlling the data latch and the enable control latch such that the data latch and the enable control latch remain latched if the mask flag in the mask latch is of a predetermined state;

first multiplexing means for controllably providing said data latch output to the input of said three-state output buffer; and second multiplexing means for controllably providing said enable control latch output to the control input of said three-state output buffer, whereby said three-state output buffer is controlled by the output of said enable control latch.

3. A boundary scan test cell system comprising:

a scan flip-flop having an input and providing a scan flip-flop output;

a mask latch responsive to the scan flip-flop output for latching a binary mask flag and providing a mask latch output;

an input buffer for receiving a binary input and providing an input buffer output;

control means responsive to said mask latch output for providing an input to said scan flip-flop input such that said scan flip-flop output is provided as the input to said scan flip-flop when the mask flag latched in said mask latch is of a first state, and such that the output of said input buffer is provided as the input to said scan flip-flop when said mask flag is of a second state.

* * * * *